United States Patent [19]
Erickson

[11] 3,975,678
[45] Aug. 17, 1976

[54] CRYSTAL RANGING APPARATUS FOR DETERMINING RANGE WITHIN WHICH RESONANT FREQUENCY OF CRYSTAL LIES

[75] Inventor: Bruce G. Erickson, Santa Clara, Calif.

[73] Assignee: American Micro-Systems, Inc., Santa Clara, Calif.

[22] Filed: May 19, 1975

[21] Appl. No.: 578,608

[52] U.S. Cl................................. 324/56; 324/79 D
[51] Int. Cl.² ................... G01R 29/22; G01R 23/02
[58] Field of Search................. 324/56, 78 D, 79 D; 331/49; 84/454; 328/141

[56] References Cited
UNITED STATES PATENTS

| | | | |
|---|---|---|---|
| 2,411,298 | 11/1946 | Shore | 324/56 X |
| 2,476,954 | 7/1949 | Blackburn | 324/56 |
| 3,207,995 | 9/1965 | Beer et al. | 331/49 |
| 3,530,377 | 9/1970 | Tanzman | 324/56 |
| 3,840,804 | 10/1974 | Sauerland | 324/56 |
| 3,861,266 | 1/1975 | Whitaker | 84/454 |

OTHER PUBLICATIONS
Terman et al., *Electronic Measurements* McGraw–Hill, Second Edition, 1952, Sec. 5–7, pp. 215–220.

*Primary Examiner*—Gerard R. Strecker
*Attorney, Agent, or Firm*—Owen, Wickersham & Erickson

[57] ABSTRACT

Apparatus for ascertaining that the resonant frequency of a crystal frequency determining element lies within a predetermined frequency range is disclosed. A crystal whose frequency is to be measured is connected to an oscillator which provides vertical and horizontal deflection signals to a cathode ray tube device. Two crystal controlled signal generators provide series of short duration output impulses which are applied to the control grid of the cathode ray tube. One oscillator operates at the upper frequency limit of the frequency range, and the other oscillator operates at the lower frequency limit. If the crystal undergoing tests lies between the two frequencies of the two reference generators, two spots appearing on the screen of the cathode ray tube will rotate countercurrent with one another. If the frequency of the crystal undergoing test lies outside of the frequency range fixed by the two signal generators, those spots will rotate in the same direction, either clockwise or counterclockwise, depending upon whether the frequency of the crystal lies above or below the desired range.

8 Claims, 5 Drawing Figures

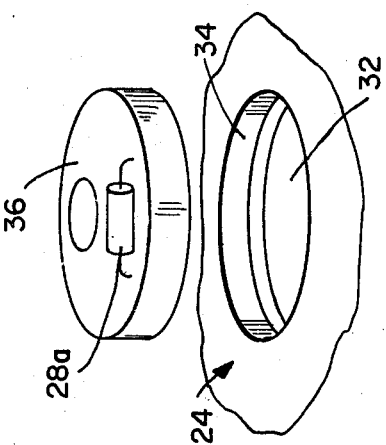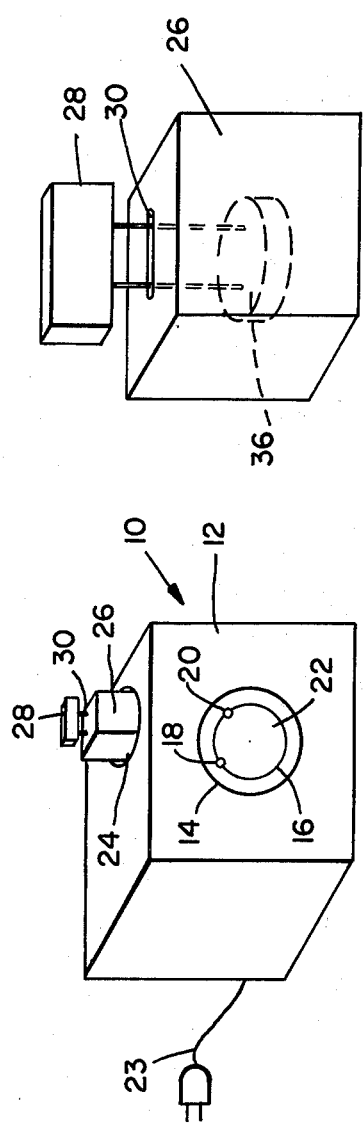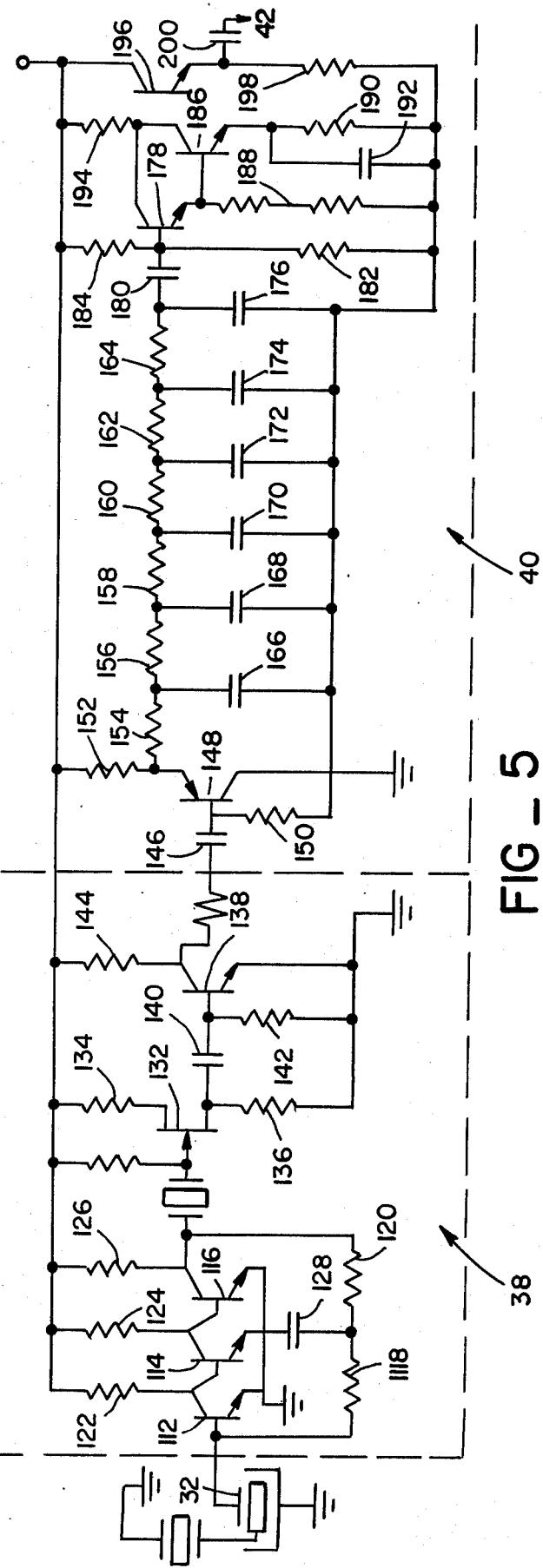

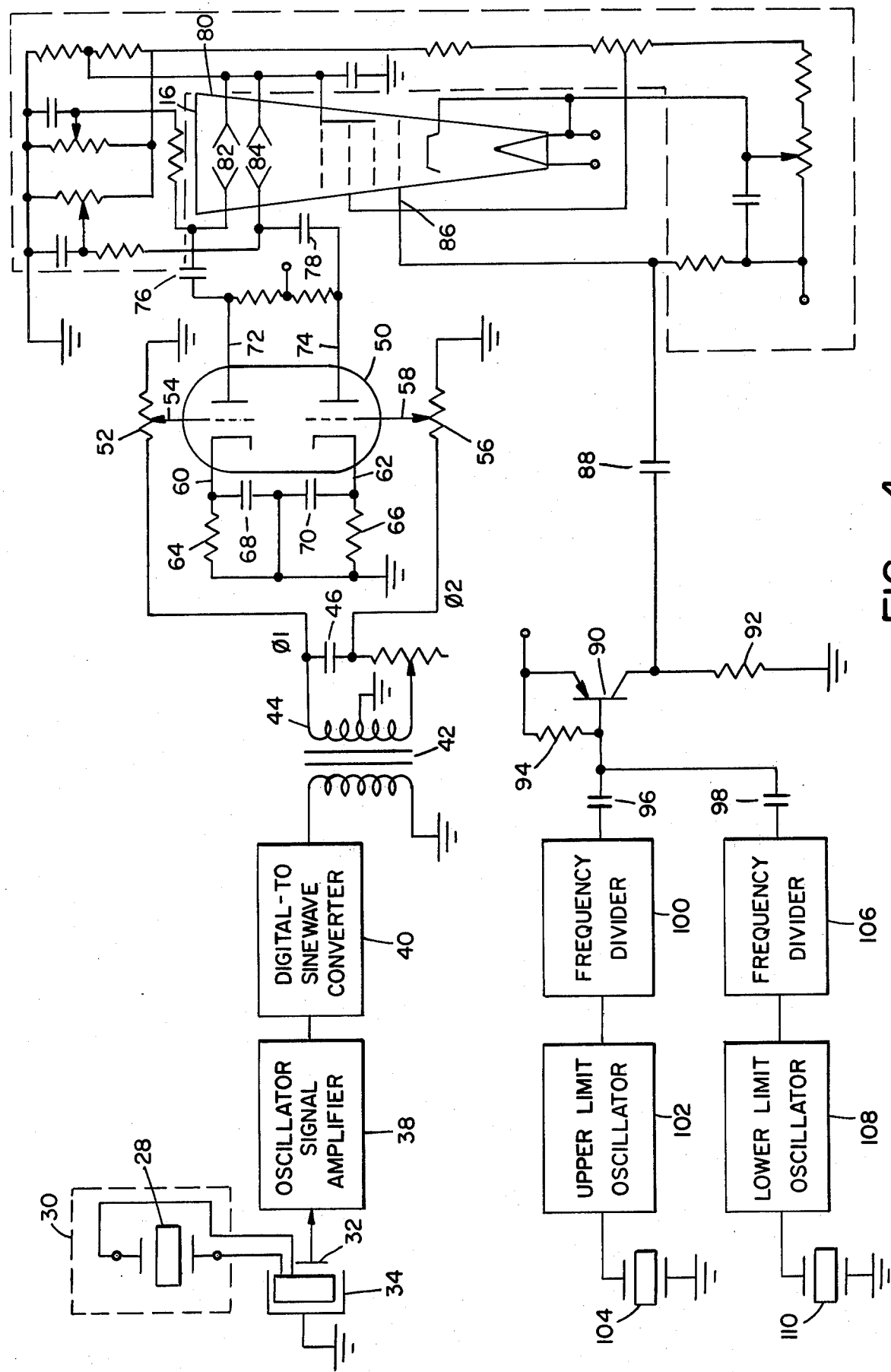

CRYSTAL RANGING APPARATUS FOR DETERMINING RANGE WITHIN WHICH RESONANT FREQUENCY OF CRYSTAL LIES

BACKGROUND OF THE INVENTION

The present invention relates to an electronic visual display test apparatus, and more particularly it relates to a test instrument providing a visual display wherein two display elements move countercurrent with each other when the frequency of the crystal undergoing test lies within a predetermined acceptable frequency range.

Certain crystalline materials when subjected to the influence of an electrical field, tend to vibrate at a periodic rate, commonly known as the resonant frequency. These vibrations have long been used in crystal oscillator circuits to control the frequency of the oscillator, because the crystal presents a very low impedance feedback path to the oscillator at precisely its resonant frequency. The instrinsic resonant frequence of a crystal typically varies from crystal to crystal because of a number of factors which cannot be completely controlled such as physical size and temperature. However, the resonant frequency of any crystal can be made to vary slightly by the addition and substraction of capacitance or inductance. Consequently, precision electronic apparatus using time base crystal oscillators provide a small trimmer capacitor or inductor to enable tuning of a crystal to a precise desired frequency. Incident to the production in quantity of such instruments, such as digital electronic timepieces, it has been necessary to ascertain whether the crystals to be included in such timepieces have frequencies lying within the range of adjustment provided by the timepieces. The present invention provides a visual display set that makes possible a rapid determination of whether incoming crystals operate at frequencies lying within the predetermined range.

Heretofore, determination of the range of a quartz crystal has been accomplished primarily with test oscillator circuits and complex peripheral apparatus such as precision digital frequency counters capable of displaying the actual crystal frequency. Operators have viewed such counters and then mentally determined whether the indicated crystal frequency was within or beyond the acceptable frequency range. The use of those frequency counters, especially in production line situations, resulted in eye strain and undue operator fatigue. Errors in accepting crystals with frequencies out of range resulted in subsequent difficulties with equipment including those erroneously accepted crystals. In addition, each digital frequency counter tended to be very expensive because of the substantial costs of the precision master oscillators which were required and contained in each such counter. In addition, reading the required digits of such counter caused the operator to spend a substantial amount of time with each crystal undergoing range check. Thus, incoming crystal acceptance rates were slow because of delays at the test station, a drawback only overcome by increasing the number of such stations. These and other disadvantages are overcome by the present invention.

In view of the foregoing, it is an object of the present invention to provide a simple visual indicator enabling rapid and unmistakable determination that an incoming crystal oscillates at a frequency lying within a predetermined range.

Another object of the present invention is to provide an incoming crystal inspection unit wherein display elements representing each limit of the acceptable frequency range move countercurrent to one another when the incoming crystal undergoing tests lies within the range.

A further object of the present invention is to provide an incoming crystal inspection unit which is highly portable and self-contained that may be manufactured at a cost far less than such units heretofore available.

BRIEF SUMMARY OF THE INVENTION

The foregoing and other objects are accomplished by a visual incoming crystal inspection unit for determining that the crystal resonant frequency lies within the predetermined acceptable range. The unit includes an oscillator connected to the crystal undergoing test, an amplifier for the incoming crystal signal, a phase shift network, and a deflection circuit connected to the phase shift network which provides deflection voltages to the vertical and horizontal elements of the cathode ray tube display device. The electron beam of the cathode ray tube is modulated by two series of short duration impulses. One series of impulses is provided by a crystal oscillator operating at a frequency related to the upper most acceptable limit of the incoming crystal frequency range. The other series of impulses is provided by another crystal oscillator operating at the lower limit of the incoming crystal frequency. The outputs of the oscillators are passed through a differentiator network to provide the impulses which are then combined and applied to the control grid to provide two spots on the screen of the cathode ray tube when the frequency of the incoming crystal lies between the limits by the oscillators providing the impulse series, the spots move countercurrent about a circular locus. If the incoming crystal is above or below the acceptable range, the spots rotate in the same direction, one way or the other.

Other objects, advantages and features of the invention will become apparent from the following detailed description of a preferred embodiment presented in conjunction with the accompanying drawings.

BRIEF DESCRIPTION OF THE DRAWINGS

FIG. 1 is a view in perspective of a self-contained incoming crystal inspection unit of the present invention. A cathode ray tube screen with two spots moving about a locus (shown in dotted lines) is shown. A crystal oscillator unit is positioned in an electrostatic sensor well on top of the unit.

FIG. 2 is an enlarged view of the crystal oscillator unit shown in FIG. 1. An electronic digital timepiece is shown in broken lines to be within the oscillator unit.

FIG. 3 is a greatly enlarged view in perspective of the sensor well of the unit of FIG. 1. A different digital timepiece is shown above the sensor well with the arrow and dashed line indicating the placement of the timepiece into the well. FIG. 4 is a schematic and block diagram of the circuitry of the unit of FIG. 1.

FIG. 4 is a schematic diagram of the circuitry of the unit of FIG. 1 wherein the oscillator signal amplifier digital-to-sinewave converter and upper and lower limit oscillator and frequency dividers are included in block diagram format. Conventional cathode ray tube deflection circuitry is shown to be within the dashed portion of FIG. 4.

FIG. 5 is a schematic circuit diagram of the oscillator signal amplifier and digital-to-analog converter of circuitry of FIG. 4.

DESCRIPTION OF THE PREFERRED EMBODIMENT

An incoming crystal inspection unit 10 is contained in a suitable housing 12 with an opening 14 accommodating the display screen 16 of the cathode ray tube. Two dots 18 and 20 are shown on the cathode ray tube screen 16 and are moving along a generally circular path 22. A line cord 23 provides electrical power to the unit 10 from a standard outlet.

A watch module sensor well 24 is provided in a top portion of the housing 12. In the sensor well is positioned a self-contained watch module unit 26 which has a time base generator element controlled by a quartz crystal 28 (which is the crystal whose frequency is undergoing inspection). As shown in the enlarged view in FIG. 2, the crystal 28 undergoing inspection may be conveniently plugged into a suitable socket 30 mounted in the watch module unit 26.

Referring now to FIG. 3, the sensor well 24 includes an electrostatic sensor element 32 which may be in the bottom of the well. Peripheral shielding 34 is provided to minimize unwanted signals from extraneous sources. In lieu of the watch module 26 shown in FIGS. 1 and 2, a basic watch module 36 carrying a modified form of crystal 28a may be placed directly into the sensor well 24 as shown in FIG. 3. Whether the module 36 is employed, it is important to utilize the circuitry of the type of electronic instrument into which the incoming crystal will be incorporated in performing the ranging measurements by the apparatus 10.

Referring now to FIG. 4, the circuitry of the unit 10 may be described. The electrostatic sensor 32 is shown surrounded by the peripheral shielding 34 of the sensor well 24. The sensor element 32 provides an input to an oscillator signal amplifier 38 which greatly amplifies the signal of the time base generating element in, e.g. the watch module 36. The oscillator signal smplifier may include bandpass filters to pass the desired oscillator frequency and reject unwanted frequencies. A rather symmetrical square wave output from the amplifier 38 is applied as an input to a digital-to-sinewave converter 40, the output of which is a sinewave at the oscillator frequency which is applied to the primary winding of the transformer 42.

The center tapped secondary 44 of the transformer 42 is applied to phase shifting network made up of a capacitor 46 and a variable resistor 48 to produce deflection drive signals $\phi 1$ and $\phi 2$ which are shifted in phase approximately 90° relative to each other. The signals $\phi 1$ and $\phi 2$ are applied as inputs to a high gain dual triode vacuum tube 50 with the $\phi 1$ signal applied through a variable resistor 52 to a first control grid 54 and the $\phi 2$ signal applied through a variable resistor 56 to a control grid 58. Cathodes 60 and 62 are biased for class A operation by resistors 64 and 66 respectively. Bypass capacitors 68 and 70 eliminate degenerative feedback in the cathode circuits. plates 72 and 74 are applied through blocking capacitors 76 and 78 to deflection elements of a cathode ray tube 80. With plates 72 being connected to the horizontal deflection elements 82, and with plate 74 being connected to the vertical deflection elements 84. A control grid 86 of the cathode ray tube 80 is used to modulate the electron beam emission from the cathode to provide a trace on the screen 16 of the cathode ray tube 80. The focusing and intensity circuitry shown in the dashed partion of FIG. 4 are conventional and well understood to those skilled in the art and will not be described in detail herein.

On the control grid 86 of the cathode ray tube 80 are two series of impulses of very short duration. These two pulses produce spots 18 and 20 on the screen 16. The pulses are applied to the grid 86 through a blocking capacitor 88 from the collector of a p-n-p transistor 90 which is powered from a +V power line. Collector resistor 92 and base bias resistor 94 are selected to cause the transistor 90 to operate near saturation.

The base of transistor 90 is supplied with pulses through two small value differentiating capacitors 96 and 98.

One set of pulses, being the upper limit pulses, are supplied to the base of the transistor 90 through the differentiating capacitor 96. These pulses are produced from a square wave output of a frequency divider 100 which receives its input from an upper limit crystal oscillator 102 which is controlled by a crystal 104 operating at a predetermined upper frequency range limit.

The other series of impulses is applied to the base of the transistor 90 after being differentiated by capacitor 98. These pulses are divided to the desired frequency by a frequency divider 106 receiving its input from a lower limit crystal oscillator 108 controlled by a crystal 110 selected to resonate at a predetermined lower frequency range limit.

Referring now to FIG. 5, signals generated in the watch module 36 and picked up by the electrostatic sensor 32 are provided at the input of a very high gain amplifier section comprising transistors 112, 114 and 116. Resistors 118 and 120 are selected to bias the transistor 112, 114 and 116 to class A operation in connection with collector resistors 122, 124 and 126. A large filter capacitor 128 limits feedback to provide very high gain through 112, 114 and 116. The collector output of transistor 116 is passed through a narrow bandpass crystal filter 130 which establishes the bandpass characteristics of the entire unit. The crystal filter 130 is lightly loaded to the gate of a p-channel junction field effect transistor 132. A source resistor 134 and a drain resistor 136 are provided to bias a field effect device 132 as a high gain class A amplifier.

The output of the transistor 132 is coupled to the base of the bipolar transistor 138 through a large value blocking capacitor. The transistor 138 is driven to saturation by a base resistor 142 in combination with the load resistor 144, so that a symmetrical square wave appears at the collector of the transistor 132.

The digital-to-sinewave converter circuit 40 receives the symmetrical square wave at the collector of the transistor 138 through a suitable large value blocking capacitor 146 to the base of the input transistor amplifier 148. A bias resistor 150 holds the transistor 148 in class A operation, and an emitter transistor 152 provides a load for the emitter follower connection of the transistor 148.

An integrator network comprising series connected equal value resistors 154, 156, 158, 160, 162 and 164 and check capacitors 166, 168, 170, 172, 174 and 176 function to integrate the square wave at the emitter of the transistor 148 into a sinewave at the base of the transistor amplifier 178 which is provided from the integrator network through a suitable large value blocking capacitor 180. Bias resistors 182 and 184 provide for class A operation of the transistor 178 and maintain a relatively high impedance input. The transistor 178 is Darlington connected to a transistor 186 through a suitable shunt resistor 188. A resistor 190 and a bypass capacitor 192 establish the bias level for the transistor 186 in combination with resistor 188, and a load resistor 194. The collector of the transistor 186 is connected to the base of an emitter follower output transistor 196. An emitter resistor 198 provides a low output impedance path for the sinewave signal which is passed through a blocking capacitor 200 to the primary of the transformer 42, as shown in FIG. 4.

The operation of the incoming crystal inspection unit 10 may be explained with reference to the circuitry previously discussed. An incoming crystal 28 to be inspected is plugged into the crystal socket 30 or directly connected in a watch module 36. The watch module unit 26, or watch module 36, is self-contained and operative, and it is placed into the sensor well 24, wherein time base signals having a frequency determined by the crystal undergoing inspection, are picked up by the sensor 32. Other signals from the watch module 36 are also picked up. All of the signals sensed are amplified by the transistor amplifiers 112, 114 and 116 in the oscillator signal amplifier 38. The bandpass filter 130 selects the time base signal set by the crystal undergoing inspection and passes that signal to the digital-to-sinewave converter 40. All other signals are rejected by the bandpass filter 130. The transformer 42 provides two deflection voltages at the secondary 44, a first voltage $\phi 1$ and a second voltage $\phi 2$ which is phase shifted from $\phi 1$ in accordance with the setting of the variable resistor 48. Input levels to the vacuum tube 50 are controlled by the variable resistors 52 and 56 so that essentially equal deflection voltages will be applied to the horizontal 82 and vertical 84 deflection plates of the cathode ray tube 80. These deflection voltages produce a generally circular trace 22 on the screen 16.

The upper limit oscillator 102 provides an output signal preselected to establish the upper limit of an acceptable crystal 28. The oscillator 102 may operate at the same frequency as the crystal 28, or, in the embodiment shown, the crystal 104 and oscillator 102 are at a higher frequency, and the frequency divider 100 is provided to divide the output frequency of the oscillator 102 to the same frequency as that of the crystal 28. In like measure, the lower limit oscillator establishes the lower limit of acceptable crystals. Its signal is also divided by the frequency divider 106 in the manner explained in connection with the divider 100. The capacitors 96 and 98 differentiate the outputs of the dividers 100 and 106 respectively into two series of impulses of very short duration with respect to period. These impulses are then applied to the control grid 86 of the cathode ray tube 80 to modulate the emission of electrons from the cathode to produce two spots 18 and 20 moving along the path 22 on the screen 16 of the cathode ray tube.

If the natural resonant frequency of the crystal 28 undergoing incoming inspection lies between the upper limit and the lower limit, the spots 18 and 20 will rotate in opposite directions along the trace 22. If the incoming crystal 28 has a resonant frequency above the upper limit, then both spots 18 and 20 will rotate in a first direction. If the incoming crystal 28 has a resonant frequency lower than the lower acceptable limit, then the spots 18 and 20 will rotate in the other direction along the trace 22. Thus, an operator can rapidly determine the acceptability of a crystal by simply viewing the direction of movement of the spots. And, the operator can segregate the crystals easily into those which are within range, those which are above range, and those which are below range.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. Vibrating crystal testing apparatus providing a visual indication that the resonant frequency of an oscillating piezoelectric crystal undergoing testing lies within a predetermined narrow frequency range of less than one octave, including in combination:
   crystal oscillator means connected to a said crystal for generating a crystal signal therefrom corresponding to the resonant frequency thereof;
   upper limit reference generator means for generating a signal corresponding to an upper limit of said range;
   lower limit reference generator means for generating a signal corresponding to a lower limit of said range;
   visual display means for displaying two moving visual elements and including visual display drive means connected to said crystal oscillator means, said upper limit reference generator means and said lower limit reference generator means, said display drive means for providing one of said elements moving in a first direction in accordance with the change in phase relationship between the said crystal and said upper limit reference signal, and for providing the other element moving in a second direction in accordance with the change in phase relationship between said crystal signal and said lower limit reference signal,
   whereby when said first direction is counter to said second directon said resonant frequency is thereby determined to be within said range and when said first direction is the same as said second direction said resonant frequency is thereby determined to be outside said range.

2. Vibrating crystal testing apparatus providing a visual indication that the resonant frequency of an oscillating piezoelectric crystal to be checked lies within a predetermined narrow frequency range of less than one octave, including in combination:
   crystal oscillator means connected to a said crystal to be checked for generating a crystal signal therefrom corresponding to its resonant vibrating frequency;
   visual display means for providing a display of two spots moving along a locus, said visual display means including display drive means connected to said crystal oscillator so that said crystal signal operatively determines said locus;
   upper limit reference generator means connected to said visual display drive means for generating a signal corresponding to an upper limit of said range, said display drive means combining said upper limit signal and said crystal signal together for providing on said display means one of the two said spots moving along said locus;

lower limit reference generator means connected to said visual display drive means for generating a signal corresponding to a lower limit of said range, said display drive means combining said lower limit signal and said crystal signal together for providing on said display means the other of the two said spots moving along said locus, whereby counterdirectional movement of said spots indicates that the resonant frequency of said crystal lies within said range and codirectional movement of said spots indicates that said resonant frequency lies outside said range.

3. The apparatus of claim 2 wherein said visual display means comprises a cathode ray tube display device having a screen, beam deflection elements and a beam intensity control element; said crystal oscillator means being connected to said deflection elements of said device in a way that provides a generally circular trace on said screen for said locus; and, said upper limit output signals and lower limit output signals are two shaped series of recurrent short duration impulses applied together to said beam intensity control element of said device to provide said two visible spots moving along said trace.

4. The apparatus of claim 2 wherein said crystal oscillator means comprises an appliance of the type in which a said crystal to be checked is intended to be used, and additionally comprising electrostatic coupling means between said crystal oscillator means and said visual display means for coupling said crystal oscillator means to said visual display means to provide said locus.

5. The apparatus of claim 4 wherein said appliance comprises a self-contained digital electronic watch.

6. The apparatus of claim 5 wherein said electrostatic coupling means comprises a sensor plate located in a shielded well in said apparatus, said well being sized to receive said watch substantially therewithin.

7. A method for checking vibrating crystals by providing a visual indication that the resonant frequency of an oscillating piezoelectric crystal being checked lies within a predetermined narrow frequency range of less than one octave, including the steps of:

generating an electrical signal from said crystal, generating an upper limit reference signal at the upper limit of said range, generating a lower limit reference signal at the lower limit of said range, providing a driven visual display having plural moving display elements wherein one said element is driven to move in accordance with the change in relative phase between said electrical signal from said crystal and said upper limit reference signal, and another said element is driven to move in accordance with the change in relative phase between said electrical signal from said crystal and said lower limit reference signal, whereby counterdirectonal movements of said elements indicate that the resonant frequency lies within said range and codirectonal movements of said elements indicate that the resonant frequency lies outside said range.

8. A method of checking vibrating crystals by providing a visual indication that the resonant frequency of an oscillating piezoelectric crystal being checked lies within a predetermined narrow frequency range of less than one octave, including the steps of:

generating an electrical signal from said crystal;

dividing said electrical signal into two components, each having a predetermined phase shift relative to the other;

applying one of said components to a vertical deflection control element of an oscilloscope display device and the other of said components to a horizontal deflection control element of said oscilloscope to thereby deflect an electron beam generated within a cathode ray tube in said oscilloscope to form a generally circular trace on a screen thereof;

generating an upper limit reference signal at the upper limit of said range;

generating a lower limit reference signal at the lower limit of said range;

shaping said reference signals into two series of recurrent short duration impulses;

simultaneously applying said two series of impulses to a beam intensity control element of said oscilloscope to provide two moving spots along said trace on said display screen of said cathode ray tube;

whereby counterdirectional movements of said spots indicate that the resonant frequency lies within said range and codirectional movements of said spots indicate that the resonant frequency lies outside said range.

* * * * *